United States Patent
Hu et al.

(10) Patent No.: US 9,194,920 B2
(45) Date of Patent: Nov. 24, 2015

(54) MAGIC ANGLE SPINNING NUCLEAR MAGNETIC RESONANCE APPARATUS AND PROCESS FOR HIGH-RESOLUTION IN SITU INVESTIGATIONS

(71) Applicant: BATTELLE MEMORIAL INSTITUTE, Richland, WA (US)

(72) Inventors: Jian Zhi Hu, Richland, WA (US); Jesse A. Sears, Jr., Kennewick, WA (US); David W. Hoyt, Richland, WA (US); Hardeep S. Mehta, Kennewick, WA (US); Charles H. F. Peden, West Richland, WA (US)

(73) Assignee: BATELLE MEMORIAL INSTITUTE, Richland, WA (US)

( * ) Notice: Subject to any disclaimer, the term of this patent is extended or adjusted under 35 U.S.C. 154(b) by 500 days.

(21) Appl. No.: 13/648,751

(22) Filed: Oct. 10, 2012

(65) Prior Publication Data
US 2014/0099730 A1  Apr. 10, 2014

(51) Int. Cl.
*G01N 24/00* (2006.01)
*G01R 33/30* (2006.01)
*G01R 33/46* (2006.01)

(52) U.S. Cl.
CPC .............. *G01R 33/307* (2013.01); *G01R 33/46* (2013.01); *Y10T 436/24* (2015.01)

(58) Field of Classification Search
CPC .............. C01B 31/043; C01B 31/0476; C01B 31/0423; C01B 2204/32; C01B 33/38; C01B 39/04; C01B 39/48; C01B 37/02; C01B 2202/02; C01B 2202/06; C01B 31/0273; C01B 37/00; C01B 39/00; C01B 31/0484; Y10T 436/24; G01R 33/307; G01R 33/46; G01R 33/48; G01R 33/30
See application file for complete search history.

(56) References Cited

PUBLICATIONS

Isbester et al. "NMR probe for heterogeneous catalysis with isolated reagent flow and magic-angle spinning", Catalysis Today, 1999, v. 49, pp. 363-375.*
Anderson, M. W., et al., A combined MAS nuclear magnetic resonance spectroscopy, in situ FT infrared spectroscopy and catalytic study of the conversion of allyl alcohol over zeolite catalysts, Catalysis Letters 31, 1995, 377-393.
Bucholz, A., et al., Sequential Steps of Ammoniation of the Microporous Silicoaluminophosphates H-SAPO-34 and H-SAPO-37 Investigated by Insitu CF MAS NMR Spectroscopy, The Journal of Physical Chemistry B., 108, 10, 2004, 3107-113.
Derouane, E. G., et al., In situ MAS NMR investigations of molecular sieves and zeolite-catalyzed reactions, Catalysis Letters, 58, 1999, 1-19.
Hunger, M., In situ flow MAS NMR spectroscopy: State of the art and applications in heterogeneous catalysis, Progress in Nuclear Magnetic Resonance Spectroscopy, 53, 2008, 105-127.

(Continued)

*Primary Examiner* — Yelena G Gakh
(74) *Attorney, Agent, or Firm* — James D. Matheson

(57) ABSTRACT

A continuous-flow (CF) magic angle sample spinning (CF-MAS) NMR rotor and probe are described for investigating reaction dynamics, stable intermediates/transition states, and mechanisms of catalytic reactions in situ. The rotor includes a sample chamber of a flow-through design with a large sample volume that delivers a flow of reactants through a catalyst bed contained within the sample cell allowing in-situ investigations of reactants and products. Flow through the sample chamber improves diffusion of reactants and products through the catalyst. The large volume of the sample chamber enhances sensitivity permitting in situ $^{13}C$ CF-MAS studies at natural abundance.

16 Claims, 8 Drawing Sheets

(56) References Cited

PUBLICATIONS

Hunger, M., et al, A New MAS NMR Prob for in situ Investigations of Hydrocarbon Conversion on Solid Catalysts Under Continuous-flow conditions, Journal of the Chemical Society-Chemical Communications, 14, 1995, 1423-1424.

Hunger, M., et al., Conversion of Propan-2-ol on Zeolites LaNaY and HY Investigated by Gas Chromatographry and in Situ MAS NMR Spectroscopy under Continuous-Flow Conditions, Journal of Catalysis, 167, 1997, 187-197.

Hunger, M., et al., In situ MAS NMR spectroscopy of surface compounds formed from methanol and from a toluene/methanol mixture on basic zeolite X, Journal of Molecular Catalysis A: Chemical, 156, 2000, 153-161.

Hunger, M., et al., A technique for simultaneous in situ MAS NMR and on-line gas chromatographic studies of hydrocarbon conversions on solid catalysts under flow conditions, Catalysis Letters, 57, 1999, 199-204.

Ivanova, I. I., et al., Impact of in situ MAS NMR techniques to the understanding of the mechanisms of zeolite catalyzed reactions, Chemical Society Reviews, 39, 12, 2010, 5018-5050.

Krawietz, T. R., et al., Alkali Metal Oxides, Peroxides, and Superoxides: A Multinuclear MAS NMR Study, Journal of Physical Chemistry A, 102, 45, 1998, 8779-8785.

Seiler, M., et al., Conversion of methanol to hydrocarbons on zeolite HZSM05 investigated by in situ MAS NMR spectroscopy under flow conditions and on-line gas chromatography, Catalysis Letters, 62, 1999, 139-145.

Ivanova, I. I., Application of in situ MAS NMR for elucidation of of reaction mechanisms in heterogeneous catalysis, Colloids and Surfaces A—Physiochemical and Engineering Aspects, 158, 1999, 189-200.

Haw, J. F., In situ NMR of heterogeneous catalysis: new methods and opportunities, Topics in Catalysis, 8, 1999, 81-86.

Haw, J. F., et al., In Situ NMR Investigations of Heterogeneous Catalysis with Samples Prepared under Stand and Reaction Conditions, Angewandte Chemie-International Edition, 37, 7, 1998, 948-949.

Carpenter, T. A., et al., Sealed Capsules for Convenient Acquisition of Variable-Temperature Controlled-Atmosphere Magic-Angle-Spinning NMR Spectra of Solids, Journal of Magnetic Resonance, 68, 1986, 561-563.

Xu, T., et al., The development and applications of CAVERN methods for in situ NMR studies of reactions on solid acids, Topics in Catalysis, 4, 1997, 109-118.

Zhang, W., et al., A high-resolution solid-state NMR study on nanostructured HZSM-5 zeolite, Catalysis Letters, 60, 1999, 89-94.

Zhu, K, et al., Characterization of Dispersed Heteropoly Acid on Mesoporous Zeolite Using Solid-State 31P NMR Spin-Lattice Relaxation, Journal of the American Chemical Society, 131, 28, 2009, 9715-9721.

Van Gorkum, L. C. M., et al., Solid-State Lead-207 NMR of Lead(II) Nitrate: Localized Heating Effects at High Magic Angle Spinning Speeds, Magnetic Resonance in Chemistry, 33, 1995, 791-795.

Te Velde, G., et al., Chemistry with ADF, Journal of Computational Chemistry, 22, 9, 2001, 931-967.

Herrera, J. E., et al., Synthesis, characterization, and catalytic function of novel highly dispersed tungsten oxide catalysts on mesoporous silica, Journal of Catalysis, 239, 1, 200-211.

Macht, J., et al., Mechanistic Consequences of Composition in Acid Catalysis by Polyoxometalate Keggin Clusters, Journal of the American Chemical Society, 130, 31, 2008, 10369-10379.

Harris, R. K., et al., NMR Spectra of the BnAA'Bn' Type Studies of But-2-ene and Related Compounds, Journal of Molecular Spectroscopy, 28, 1968, 191-203.

Jackman, L. M., et al., The Nuclear Magnetic Resonance Spectrum of 2-Butanol, Journal of the American Chemical Society, 88, 23, 1966, 5565-5570.

Wiitala, K. W., et al., Evaluation of various DFT protocols for computing 1H and 13C chemical shifts to distinguish stereoisomers: diastereomeric 2-, 3-, and 4-methylcyclohexanols as a test set, Journal of Physical Organic Chemistry, 20, 2007, 345-354.

* cited by examiner

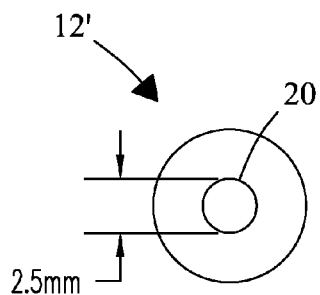
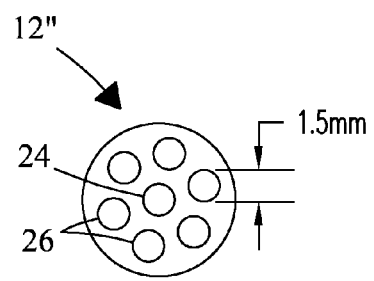
FIG. 2A    FIG. 2B
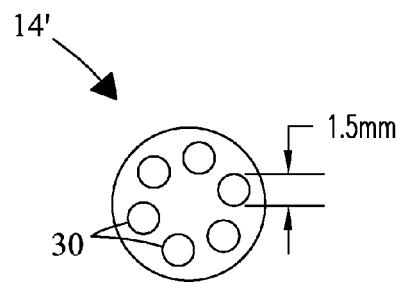
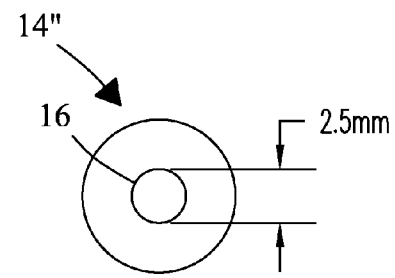
FIG. 2C    FIG. 2D

MAGIC ANGLE SPINNING NUCLEAR MAGNETIC RESONANCE APPARATUS AND PROCESS FOR HIGH-RESOLUTION IN SITU INVESTIGATIONS

STATEMENT REGARDING RIGHTS TO INVENTION MADE UNDER FEDERALLY-SPONSORED RESEARCH AND DEVELOPMENT

This invention was made with Government support under Contract DE-AC05-76RLO1830 awarded by the U.S. Department of Energy. The Government has certain rights in the invention.

FIELD OF THE INVENTION

The present invention relates generally to magic angle spinning (MAS) nuclear magnetic resonance (NMR) spectroscopy. More particularly, the present invention relates to a new large volume, continuous-flow MAS rotor, probe, and process that permit magic angle spinning nuclear magnetic resonance spectroscopic investigations in situ.

BACKGROUND OF THE INVENTION

Understanding mechanisms of reactions on catalysts requires the nature of active sites of the catalyst and the dynamic processes of the reactions to be understood starting when reactants enter the reaction zone, reaction intermediates begin to form, until final eluted reaction products exit the catalyst reaction system. For reactions involving simple species, in-situ techniques such as UV-visible and IR spectroscopies are typically used to probe the intermediates adsorbed on the catalyst. However, for reactions such as selective oxidations of organics, where reaction products and intermediates are complex, a single spectroscopic tool is insufficient. High resolution magic angle spinning (MAS) nuclear magnetic resonance (NMR) is a powerful and versatile technique for studying molecular structures and reaction dynamics regardless of whether the system under investigation is a solid, semi-solid, or a heterogeneous system containing mixtures of e.g., solid, semi-solid, liquid, and gaseous phases. While a number of in situ MAS NMR techniques have been developed to study heterogeneous catalysts, MAS investigations of catalyst reactions in situ have not yet been reported for MAS rotors with diameters larger than 7.5 mm due to technical challenges associated with sensitive detection of reactions occurring in shallow layers of catalyst beds placed in large bed volumes. The present invention addresses these needs. Additional advantages and novel features of the present invention will be set forth as follows and will be readily apparent from the descriptions and demonstrations set forth herein. Accordingly, the following descriptions of the present invention should be seen as illustrative of the invention and not as limiting in any way.

SUMMARY OF THE INVENTION

A Continuous-Flow (CF) Magic Angle Spinning (MAS) Nuclear Magnetic Resonance (NMR) rotor, probe, and process are detailed that provide for high-resolution NMR investigations of reaction dynamics, stable intermediates/transition states, and mechanisms of catalytic reactions in situ. The term "rotor" as used herein means a catalyst or solid holding device that inserts into a MAS NMR probe allowing in situ investigations or analyses involving the catalyst or solid. The term "probe" refers to the analysis instrument for conducting CF-MAS NMR investigations. The term "continuous flow" (CF) means that the introduction of carrier gas and/or reactants in a carrier gas is performed at a constant flow rate, but the rotor and probe are not limited to CF applications. For example, in some applications, stop-flow investigations can be conducted. Thus, no limitations are intended.

The magic angle spinning (MAS) nuclear magnetic resonance (NMR) rotor for high resolution in situ NMR investigations described herein includes a sample chamber with an internal volume greater than or equal to about 0.01 $cm^3$ that is configured to contain and rotate a catalyst or solid. Rotation of the catalyst or solid within the sample chamber may be synchronized with the rotation of the MAS rotor.

Rotor sizes are not limited. Rotor diameters may vary from about 3 mm to about 14 mm. In some applications, rotor diameters may be below 5 mm. In some applications, rotor diameters may be about 3.2 mm. In some applications, rotor diameters may be above 5 mm, e.g., 9.5 mm. No limitations are intended.

The MAS rotor may also include an introduction member that is operatively coupled to the sample chamber and configured to actively deliver zero reactants, one or more reactants, or mixtures of reactants into the catalyst at a pressure preferably about atmospheric pressure. However, pressures are not limited. For example, pressures through the introduction tube member may be from about 670 mm Hg to about 870 mm Hg. The term "actively delivered" as used herein means flow of reactants into or through the catalyst occurs under a driving force arising from a pressure difference at respective ends of the catalyst inside the sample chamber. The introduction member when assembled inside the MAS rotor may be enclosed within an end plug member that couples operatively to the sample chamber via one or more through-holes positioned above and that circumvolve the sample chamber and configured to deliver the one or more reactants introduced through the introduction member into the sample chamber at the top along the periphery of the catalyst therein. The introduction tube member may also couple to at least one through-hole positioned centrally above the sample chamber to deliver reactants into the catalyst at the top of the sample chamber. The end plug may comprise a ceramic or a plastic and be positioned at an end inside the MAS rotor above the catalyst and configured to rotate along with the catalyst located within the sample chamber as the MAS rotor rotates while the introduction member remains stationary.

The opening of the introduction tube at the end toward the catalyst may include a spread design in which the tube narrows in internal diameter and then expands to deliver a spray of reactants into the catalyst. The opening may couple to a single through-hole in the end plug. The end plug member may comprise a ceramic or a plastic that is positioned at an end inside the MAS rotor above the catalyst and configured to rotate along with the catalyst located within the sample chamber as the MAS rotor rotates while the introduction member remains stationary. The term "stationary" used herein with reference to the introduction tube member and the exit tube member means these components do not rotate inside the MAS NMR probe and are fixed in space.

The MAS rotor may also include an exit member that couples operatively to the sample chamber that is located at an end opposite the introduction tube member and configured to actively remove one or more products from the catalyst at a pressure below atmospheric pressure. For example, pressures through the exit tube member may be from about 0.1 mm Hg to about 760 mm Hg. No limitations are intended. The exit member when inside the MAS rotor may be enclosed within an end plug member that couples operatively to the sample chamber via one or more through-holes positioned below and that circumvolve the sample chamber at the exit end that collect the one or more reaction products along the periphery of the catalyst and deliver same through the exit member from the sample chamber. The end plug member may include a ceramic or a plastic and be positioned at an end inside the MAS rotor below the catalyst and configured to rotate with the catalyst in the sample chamber as the MAS rotor rotates while the exit member remains stationary.

The introduction member and the exit member in combination may be configured to provide a pressure difference at opposite ends inside the sample chamber that provides a flow of reactants when present into and through the catalyst and that provides a flow of reaction products when present from the catalyst out of the sample chamber.

The MAS rotor may include a spin tip with a centrally positioned through-hole or channel therein. The spin tip may couple with an end plug member positioned below the sample chamber inside the MAS rotor. The exit tube member may extend through the central through-hole in the spin tip and deliver reaction products and any unreacted reactants from the catalyst out of the sample chamber. A clearance located between the exterior surface of the exit tube member may run along the length of the through-hole in the spin tip and extend into the end plug to allow rotation of the MAS rotor, the sample chamber, the catalyst within the sample chamber, and the end plugs while the exit tube member remains stationary. The clearance may provide a separation of up to about 0.3 mm.

A clearance or separation distance of 0.05 mm or more may be positioned between an end of the introduction tube and the opening to the through-holes that lead into the catalyst or solid. A clearance or separation distance of 0.05 mm or more may be positioned between an end of the through-holes and the exit tube member leading from the catalyst reactor.

The exit tube at the exit end of the spin tip may couple operatively to a vacuum pump that provides a pressure at the exit of the sample chamber below atmospheric pressure. The pressure yields a flow of reaction products from the catalyst or the solid out of the sample chamber. The exit member at the exit end of the spin tip may further couple to a GC-mass spectrometer and supply a fraction of gas exiting the sample chamber into the GC-mass spectrometer to allow determination of the composition and/or reaction dynamics of volatile reaction products in situ.

The exit member may be extend from the exit end of the spin tip such that it may couple operatively with a vacuum pump to provide a pressure at the exit of the sample chamber that is below atmospheric pressure. The pressure at the exit may yield a flow of reaction products out of the catalyst from the sample chamber. The exit member at the exit end of the spin tip may further couple to a GC-mass spectrometer that supplies a fraction of gas exiting the sample chamber into the GC-mass spectrometer for determining the composition and reaction dynamics of volatile reaction products in situ.

The MAS rotor may define a sample chamber with an internal chamber volume greater than or equal to about 0.01 cm$^3$ configured to contain and rotate a catalyst or solid therein. The new MAS rotor with its large sample chamber volume achieves superior signal-to-noise (S/N) ratios and sensitivities previously unachieved in conventional rotor designs.

Catalysts and solids selected for use are not limited. In some applications, the catalyst may be in the form of a bed. As an example, in the exemplary 9.5 mm rotor, dimensions of the catalyst bed may include a thickness of about 8 mm and an O.D. of about 8 mm. Dimensions of the catalyst bed are not limited. Catalysts and solids introduced into the rotor sample chamber may also include a selected porosity. Porosity is not limited. In some applications, porosity may be up to about 0.5 (i.e., 50%). In some applications, porosity may be greater than about 0.5. Porosity is selected sufficient to allow an exchange of reactants into and out of pores of the porous catalyst or solid and a flow of reactants through the interstitial spaces between the catalyst or solid particles. Particle sizes of the selected catalyst or solid are also not limited. In some applications, particle size may be greater than 1 μm (micron). In some applications, particle size may be selected up to about 200 μm. In some applications, particle size may be from about 50 μm to about 100 μm. In some applications, spherical particles are preferred with diameters of at least about 0.2 mm. Solids may also include, e.g., solid reactants or other solids. No limitations are intended.

The MAS rotor may include one or more containment members positioned above and below the sample chamber adjacent the end plug members inside the MAS rotor to contain the catalyst within the sample chamber. In some applications, the containment members may each include or be composed of glass wool. The glass wool may be fashioned in the form of a disk (e.g., as disk inserts) and placed at opposite ends of the catalyst in the sample chamber to contain the catalyst within the sample chamber.

The MAS probe may include an RF coil configured to surround the sample chamber when the MAS rotor is introduced into the probe to deliver a $B_1$ excitation field through the catalyst bed as the MAS rotor spins and to receive and collect return NMR signals from reactants and products within the catalyst bed.

The MAS probe may include a gas inlet that couples to the introduction member (via, e.g., a capillary tube) that delivers a carrier gas containing zero, or one or more reactants, or a mixture into the catalyst within the sample chamber.

The MAS probe may also include a syringe pump (e.g., a programmable syringe pump) or one or more mass-flow controllers that couple operatively to the gas inlet which may be configured to deliver the carrier gas containing zero reactants or one or more reactants or a mixture of reactants into the catalyst within the sample chamber. The syringe pump may be a program-controlled syringe pump for delivering liquid reactants into the carrier gas. Flow of carrier gas may be controlled by a one or more mass flow controllers. The syringe pump or mass flow controllers may introduce the reactants at a constant rate. The syringe pump or mass flow controllers may also introduce the reactants in a pulse mode, i.e., during a short time period.

A method is also disclosed for performing high-resolution magic angle spinning (MAS) NMR investigations in situ. The method may include spinning a MAS rotor containing a catalyst or a solid located within a sample chamber at a selected speed. The sample chamber may include a chamber volume greater than about 0.01 cm$^3$. The method may include flowing zero, or one or more reactants, or a mixture of reactants through the catalyst or the solid in concert with a pressure difference generated at respective ends of the catalyst or the solid within the sample chamber.

The method may include raising the temperature of the catalyst or the solid to a temperature sufficient to react one or more reactants or a mixture of reactants when present to form one or more reaction products.

The method may also include acquiring NMR data and/or spectra as a function of time after the zero or one or more reactants or the mixture are flowed into the catalyst or the solid.

The method may also include analyzing reactions of the zero or the one or more reactants or mixtures thereof within the catalyst in situ when present within the MAS rotor as a function of flow-in time. The analyzing may include monitoring the course of reactions and/or monitoring the course of formation of zero or one or more reaction products within the catalyst within the MAS rotor in situ as a function of the flow-in time. The analyzing may be performed in concert with NMR spectroscopy.

In some applications, the MAS rotor may have a rotation speed up to about 3.5 kHz. In some applications, the rotation speed may be up to about 25 kHz. In some applications, the rotation speed may be greater than about 3.5 kHz.

The flowing may include injecting a carrier gas containing the zero or one or more reactants or a mixture of reactants into the catalyst or solid within the sample chamber at a constant flow rate. The carrier gas may include an inert gas. The flowing may include flowing a liquid containing the zero, or the one or more reactants, or the mixture of reactants into the catalyst or solid in situ within the sample chamber at a constant flow rate. The flow rate may be selected up to about 5 mL/hour. Flow rates are not limited. For example, flow rates may be constant, continuous, or variable. The flowing may be performed simultaneously with the spinning of the catalyst or the solid within the MAS rotor. The flowing may include flowing the zero or the one or more reactants or the mixture of reactants into the catalyst or solid at a pressure that is about atmospheric pressure. One or more reactants or a mixture of reactants at a natural abundance may be flowed into the catalyst or solid within the sample chamber. The term "natural abundance" used herein refers to the quantity of isotopes of a chemical element of interest naturally found in nature.

Reactants may be flowed into the catalyst or solid at a pressure of preferably about atmospheric pressure. However, pressures are not limited. In some applications, pressures may be from about 670 mm Hg to about 870 mm Hg.

Reaction products may be removed from the catalyst or solid out of the sample chamber in situ. Reaction products may be flowed out of the catalyst or solid through an exit member at a pressure below atmospheric pressure.

Analyzing the reactants and/or reaction products may include monitoring the course of reactions of the one or more reactants and/or formation of one or more reaction products within the catalyst or the solid within the MAS rotor in situ.

The sample chamber volume provides a sufficient sensitivity for in situ $^{13}C$ CF-MAS studies of reactions involving the reactants introduced into the catalyst or solid within the sample chamber inside the MAS rotor at natural abundance.

The purpose of the foregoing abstract is to enable the United States Patent and Trademark Office and the public generally, especially the scientists, engineers, and practitioners in the art who are not familiar with patent or legal terms or phraseology, to determine quickly from a cursory inspection the nature and essence of the technical disclosure of the application. The abstract is neither intended to define the invention of the application, which is measured by the claims, nor is it intended to be limiting as to the scope of the invention in any way.

BRIEF DESCRIPTION OF THE DRAWINGS

FIGS. 2a-2d show top and bottom end views of end plugs that may be employed in an embodiment of an MAS rotor of the present invention.

DETAILED DESCRIPTION

A constant (continuous) flow (CF) magic angle sample spinning (CF-MAS) nuclear magnetic resonance (CF-MAS NMR) rotor, probe, and process are described that allow investigation of reaction dynamics, stable intermediates, transition states, and mechanisms of catalytic reactions in-situ. The following description details a best mode of at least one embodiment of the present invention. It will be clear from this description that the invention is not limited to these illustrated embodiments but that the invention also includes a variety of modifications and embodiments thereto. Therefore the present description should be seen as illustrative and not limiting. While the invention is susceptible of various modifications and alternative constructions, it should be understood that there is no intention to limit the invention to the specific form disclosed, but, on the contrary, the invention is intended to cover all modifications, alternative constructions, and equivalents falling within the spirit and scope of the invention as defined in the claims.

Figures 1A, 1B:
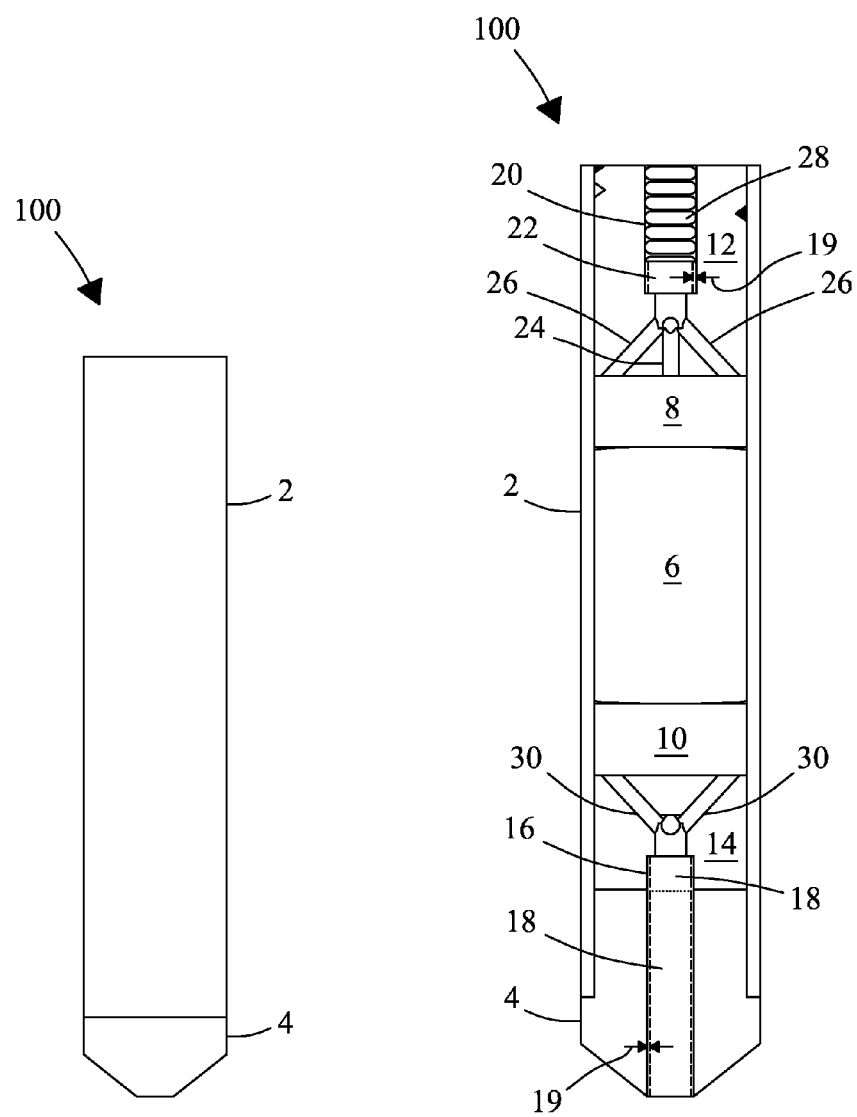
FIGS. 1a-1b show different views of a CF-MAS NMR rotor, according to an embodiment of the present invention.

FIG. 1a shows an external view of a CF-MAS NMR rotor 100 of a large chamber (sample) volume design according to one embodiment of the present invention in assembled form. The term "large" as used herein means the sample chamber (described below in reference to FIG. 1b) is free of structural components other than the chamber walls such that the chamber volume is maximized. Rotor 100 may include a rotor cylinder (sleeve) 2 and a spin (drive) tip 4. Rotor cylinder 2 may be composed of a ceramic including, e.g., zirconia ($ZrO_2$), and/or other pressure and temperature durable materials. Rotor 100 may include a diameter of from about 3 mm to about 25 mm. In some applications, rotor diameter may be below 5 mm. In some applications, rotor diameter may be about 3.2 mm. In some applications, rotor diameter may be above 5 mm. No limitations are intended. In the exemplary embodiment described hereafter, rotor 100 includes an outside diameter (O.D.) of 9.5 mm, an inner diameter (I.D.) of 8.0 mm, and a height (length) of 40 mm, but dimensions are not intended to be limited thereto.

Spin tip 4 may be constructed of a machinable plastic. Machinable plastics include, but are not limited to, e.g., polyether ether ketone polymers (e.g., PEEK®, Victrex USA, Inc., West Conshohocken, Pa., USA), polyimide-based polymers (e.g., VESPEL®, Dupont, Wilmington, Del., USA), polyamide-imide polymers (e.g., TORLON®, Solvay Advanced Polymers, L.L.C., Alpharetta, Ga., USA), chlorotrifluoroethylene polymers (e.g., KEL-F®, 3M Company, St. Paul, Minn., USA), or another machinable plastic.

FIG. 1b is a cross-sectional view showing internal components of CF-MAS rotor 100. CF-MAS rotor 100 may include a rotor sleeve 2 composed of a ceramic material such as zirconia, a rotor drive (spin) tip 4, a sample chamber 6, containment inserts 8 and 10 (e.g., glass wool inserts) and end plugs 12 and 14 (e.g., ceramic or plastic end plugs). Rotor sleeve 2 can be a commercially available zirconia MAS rotor sleeve. Rotor 100 defines a sample chamber 6 with a sample volume of at least about 0.01 cm$^3$ therein. Rotor spin tip 4 may insert into an end of rotor sleeve 2, providing rapid set-up for spinning a sample, and easy replacement of components of rotor 100 when needed. Rotor spin tip 4 may be of a pencil type design constructed of machinable plastic such as KEL-F® or VESPEL®. Spin tip 4 may include a centrally positioned through-hole or channel 16 that couples with end plug 14 positioned below sample chamber 6 through which exit (e.g., tube) member 18 (detailed further in reference to FIG. 3 below) extends inside the MAS rotor 100. Exit member 18 is configured to remove reaction products and residual reactants from the catalyst out of sample chamber 6. In the exemplary embodiment, exit tube 18 includes an outside diameter (O.D.) of 2.4 mm and an inside diameter (I.D.) of 1.4 mm, but is not limited thereto. Through-hole 16 in spin tip 4 may include a clearance 19 of about 0.05 mm up to about 0.3 mm or more that runs along the length of exit member 18 and extends into end plug 14 a distance sufficient to allow rotation of MAS rotor 100 and the catalyst within sample chamber 6 while exit member 18 remains stationary. Through-hole 16 allows removal of reaction products from the catalyst through exit member 18 out of sample chamber 6.

Disk inserts 8 and 10 may be constructed of a containment material, e.g., glass wool, or another containment material, as detailed herein. Porosity of the containment material may be up to about 0.8. Disk inserts 8 and 10 may be of any thickness that serves to retain the catalyst within sample chamber 6. In some applications, thickness of the containment material may be about 1 mm, but thickness is not intended to be limited thereto. In the exemplary embodiment (e.g., 9.5 mm rotor), inserts 8 and 10 may include a thickness of about 1 mm and a diameter of about 8 mm that matches the inner diameter (I.D.) of the rotor (FIG. 1b) cylinder, but dimensions are not intended to be limited.

End plugs 12 (top plug) and 14 (bottom plug) may be composed of, or include, ceramics such as machinable glass ceramics (e.g., MACOR®, Corning Inc., Corning, N.Y., USA) or plastics such as those detailed for spin tip 4 herein. End plug 12 may include a central through-hole (channel) 20 positioned, e.g., through the center of end plug 12 that accommodates insertion of an injection tube 22 (described further in reference to FIGS. 2a-2d and FIG. 3 below) into MAS rotor 100. In the instant embodiment (e.g., 9.5 mm MAS rotor 100), injection tube 22 may include an outside diameter (O.D.) of about 2.4 mm and an inside diameter (I.D.) of about 1.4 mm, but is not limited thereto. Channel 20 in end plug 12 may include a clearance 19 of from about 0.05 mm to about 0.3 mm positioned between the exterior surface of injection tube 22 and the inside wall of end plug 12 that runs along the length of injection tube 22. Clearance 19 allows MAS rotor 100, end plug 12, and catalyst within sample chamber 6 to rotate while injection tube 22 remains stationary therein. Reactants may be actively flowed through injection tube 22 positioned at a first end of rotor sleeve 2 into sample chamber 6 through central through-hole 24 and zero or more (e.g., 3, 4, 5, 6, or more) tilted through-holes (channels) 26 positioned above sample chamber 6. Tilted through-holes (channels) 26 are distributed evenly around sample chamber 6, e.g., below channel 20 and above disk insert 8. Central through-hole 24 allows reactants to flow directly into the catalyst at the top of sample chamber 6 and to diffuse into the catalyst. Tilted channels 26 facilitate introduction of reactants along the periphery at the top of sample chamber 6 into the catalyst. Channel 20 may include threads 28 machined along the length of channel 20 that permit a tool (not shown) to be threaded into channel 20 that removes end plug 12.

End plug 14 (bottom plug) may also include one or more (e.g., 3, 4, 5, 6, or more) tilted through-holes (channels) 30 that couple to exit tube 18 (further described in reference to FIG. 3) in end plug 14. Through-holes 30 may be symmetrically distributed around and below sample chamber 6 to collect reaction products released at the periphery of the catalyst from sample chamber 6 as MAS rotor 100 rotates. Different pressures positioned at respective ends of sample chamber 6 drives the flow of carrier gas containing reactants or gases or liquids into and diffusion through the catalyst and the flow of reaction products out of the catalyst for collection from sample chamber 6. CF-MAS rotor 100 is of an open-flow design meaning that through-holes (channels) 24, 26, and 30 are always open to provide a constant flow of reactants into catalyst reactor 6 and/or a constant flow of reaction products from catalyst reactor 6. In the figure, end plug 14 does not employ a center through-hole or channel (e.g., as used in end plug 12) to prevent rapid loss and center removal of unreacted reactants from the catalyst, but the present invention is not limited thereto. Sample chamber 6 can include a large sample volume greater than about 0.01 cm$^3$ and up to about 3 cm$^3$ that provides sufficient detection sensitivity for investigations of natural $^{13}$C abundance reactants and their associated reactions in situ.

End Plugs

FIGS. 2a-2d show top and bottom end views of end plugs employed in one embodiment [e.g., 9.5 mm MAS rotor (FIG. 1)] of the present invention, respectively. FIG. 2a shows a top end view of end plug 12. End plug 12 may insert at the top of the MAS rotor. The top end of end plug 12 may include a center through-hole (channel) 20 that includes a non-limiting diameter of about 2.5 mm to allow insertion of the introduction tube (item 22, FIG. 1) into end plug 12. The introduction tube may include an outer diameter (O.D.) of 2.4 mm, but diameters are not limited. The O.D. provides a clearance (item 19, FIG. 1b) of from about 0.05 mm to about 0.3 mm between the exterior surface of the introduction tube and the inside wall of through-hole (channel) 20. The clearance may run through end plug 12 a sufficient distance to allow the introduction tube to remain stationary while MAS rotor 100 rotates. For example, through-hole 20 may include a shape that is larger at the exit that narrows at the end of the catalyst chamber so that the introduction tube may insert into the middle of end plug 12 (see, FIG. 1b). In the exemplary embodiment, the introduction tube is not in contact with end plug 12 so that the rotor containing the end plug can rotate while the introduction tube remains stationary. The end plug may comprise a ceramic or a plastic that is positioned at an end inside the MAS rotor above the catalyst and configured to rotate along with the catalyst located within the sample chamber as the MAS rotor rotates while the introduction member remains stationary. The term "stationary" used herein with reference to the introduction tube member and the exit tube member means these components do not rotate inside the MAS NMR probe and are fixed in space. Clearances and are not limited provided rotation of MAS rotor 100 is not impeded. Smaller clearances are preferred that permit a flow of reactants into the catalyst chamber 6 that is not impeded.

FIG. 2b shows a bottom end view of end plug 12. In the figure, end plug 12 may include a center through-hole 24 that couples with the introduction tube (FIG. 1) at the top end of end plug 12 that provides a flow of reactants from the bottom through through-hole 24. The bottom surface of end plug 12 may also include peripheral through-holes 26 (e.g., up to 6 channels) symmetrically distributed along the periphery of end plug 12 above the sample chamber (FIG. 1b). Through-holes 24 and 26 are configured to provide a flow of reactants through containment disk (item 8, FIG. 1b) into the catalyst at the top and along the periphery of the sample chamber. Through-holes 24 and 26 may include a diameter of about 1.5 mm, but diameters are not intended to be limited.

FIG. 2c shows a top end view of (bottom) end plug 14 employed in the 9.5 mm MAS rotor (FIG. 1). End plug 14 may insert at the bottom of the MAS rotor (FIG. 1). As shown in FIG. 2c, the top surface of end plug 14 may include peripheral through-holes 30 (e.g., 3, 4, 5, 6, or more) symmetrically distributed along the periphery of end plug 14 around and below sample chamber 6. Through-holes 30 are configured to provide a flow of reaction products and unreacted reactants that flow under the pressure difference at the two ends of the catalyst and are released at the bottom and along the periphery of the sample chamber as the MAS rotor rotates. Through-holes 30 may include a diameter of about 1.5 mm, but diameters are not limited.

FIG. 2d shows a bottom end view of (bottom) end plug 14. The bottom surface of end plug 14 may include a center through-hole (channel) 16 that includes a non-limiting diameter of about 2.5 mm that allows insertion of the exit tube (item 18, FIG. 1) through the center of end plug 14. In the instant embodiment, exit tube 18 includes an O.D. of 2.4 mm, but diameters are not limited. The O.D. provides a clearance (item 19, FIG. 1b) of about 0.05 mm between the exterior surface of the exit tube and the inside wall of through-hole 16. The clearance runs through end plug 14 a sufficient length to allow the exit tube to remain stationary while MAS rotor 100 rotates. Clearances are not limited provided rotation of MAS rotor 100 is not impeded.

Catalysts/Solids

Catalysts and solids selected for use are not limited. Catalysts and solids introduced into the rotor sample chamber may include a selected porosity. Porosity is not limited. In some applications, porosity may be up to about 0.5 (i.e., 50%). In some applications, porosity may be greater than about 0.5. Porosity is selected sufficient to allow an exchange of reactants into and out of pores of the porous catalyst or solid and a flow of reactants through the interstitial spaces between the catalyst or solid particles. Particle sizes of the selected catalyst or solid are also not limited. In some applications, particle size may be greater than 1 µm (micron). In some applications, particle size may be selected up to about 200 µm. In some applications, particle size may be from about 50 µm to about 100 µm. In some applications, spherical particles are preferred with diameters of at least about 0.2 mm. Solids may also include, e.g., solid reactants or other solids. No limitations are intended.

CF-MAS Probe

Figure 3:
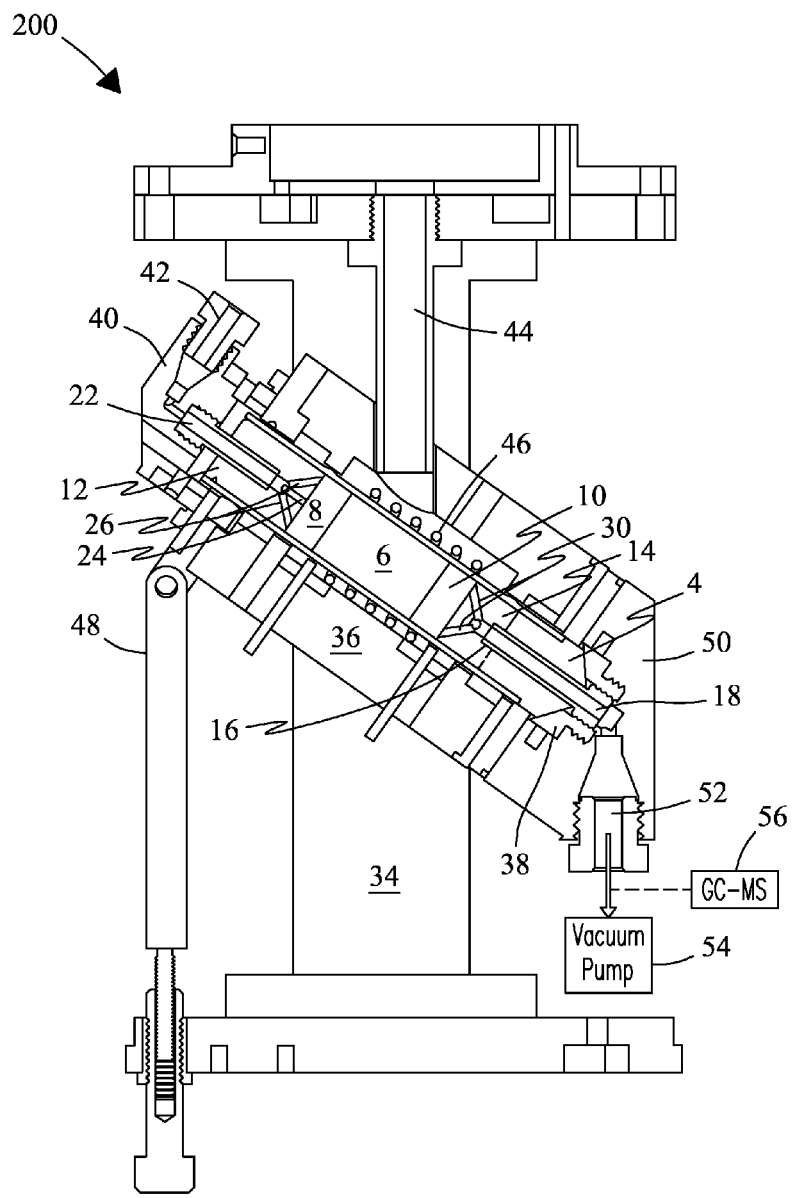
FIG. 3 shows a cross-sectional view of one embodiment of a CF-MAS probe including internal components of the present invention.

FIG. 3 shows a cross-sectional view of CF-MAS probe 200. Probe 200 may be mounted to a support block 34 that includes a rotor spinning module 36 that provides spinning of CF-MAS rotor 100 when mounted into CF-MAS probe 200. Support block 34 may include a block portion 40 that secures injection (introduction) tube 22 of rotor 100 within probe 200. Block portion 40 may also include a carrier gas inlet 42 that in operation delivers a carrier gas (not shown) into and through the catalyst (not shown) within sample chamber 6. Carrier gas may be introduced into sample chamber 6 containing no reactants, one or more selected reactants, or a mixture of various reactants. No limitations are intended. Probe 200 may include a variable temperature (VT) gas line 44 that delivers a gas at selected temperatures that heats the catalyst within sample chamber 6 to selected reaction temperatures. VT gas temperatures are not limited. Temperatures of the catalyst within the sample chamber are also not limited and may be selected to provide suitable temperatures for reaction of reactants or mixtures of reactants introduced into the catalyst. Rotor spinning module 36 of MAS probe 200 may include an NMR RF coil 46 configured to surround sample chamber 6 when MAS rotor 100 is introduced into probe 200. RF coil 46 may be configured to deliver a $B_1$ excitation field through the catalyst contained within sample chamber 6 as MAS rotor 100 spins. RF coil 46 may also collect return NMR signals received from reactants and reaction products within the catalyst for analysis thereof.

MAS probe 200 may also include a magic angle adjustment element 48 for adjusting position of the MAS rotor 100 that allows the position of rotor 100 to be set to the magic angle position when inserted into MAS probe 200.

Probe 200 may also include a block portion 50 that secures a gas-driven spinning mechanism 38 within rotor spinning module 36. Spinning mechanism 38 may couple to spin tip 4 of rotor 100 to provide spinning of rotor 100 when mounted inside probe 200. Exit tube 18 may extend from an end of rotor spin tip 4 and couple to exit capillary 52 located within block portion 50.

Exit member 18 at the exit end of spin tip 4 may couple operatively to exit capillary 52 that delivers reaction products received from sample chamber 6 through exit member 18 in concert with a vacuum pump 54 located downstream from probe 200. Vacuum pump 54 may provide a pressure at the exit end of sample chamber 6 below atmospheric pressure that yields a flow of reaction products out of the catalyst from sample chamber 6. Exit member 18 at the exit end of spin tip 6 may further couple to a GC-mass spectrometer 56 that supplies a fraction of gas exiting sample chamber 6 into GC-mass spectrometer 56 that allows determination of the composition and/or reaction dynamics of volatile reaction products in situ, as detailed herein. CF-MAS probe 200 is of an "open" design meaning through-hole channels 24, 26, and 30 can remain open to provide reactants continuously to catalyst reactor 6 or to continuously remove reaction products from catalyst reactor 6.

Carrier and Variable Temperature (VT) Gases

Carrier gases suitable for use in concert with the present invention may include inert gases including, e.g., nitrogen ($N_2$), argon (Ar), helium (He), or other inert gases known in the art. VT gases may also include inert gases.

Gas Pressures

Carrier gas pressure at the opening to the injection tube (e.g., toward the sample chamber) that introduces reactants into the catalyst within the sample chamber is preferably selected to be at about atmospheric pressure. However, pressures through the introduction tube may range from about 670 mm Hg to about 870 mm Hg. Carrier gas pressure at the exit of the sample chamber that removes reaction products from the catalyst out of the sample chamber is selected below atmospheric pressure (i.e., below 1 atm). For example, the exit tube may extend from the exit end of the spin tip and couple operatively with a vacuum pump, which provides a pressure at the exit of the sample chamber that is below atmospheric pressure, as described further herein. The difference in pressure at respective ends of the catalyst provides the flow of reaction products out of the catalyst from the sample chamber. Pressures may vary slightly (i.e., within a few mm Hg) due to the fact that the CF-MAS probe is an "open" system in which the injection tube and the exit (ejection) tube are suspended and always open (i.e., not sealed) in the CF-MAS probe.

Introduction Tube

Figure 4A:
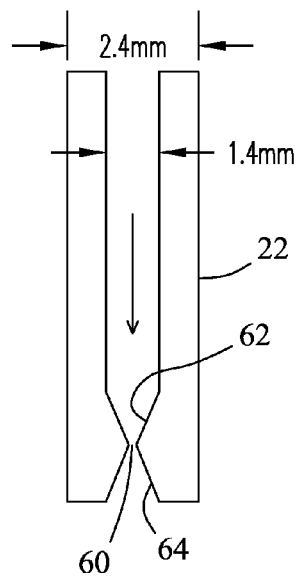
FIGS. 4a-4c shows different views of an introduction tube of a spray design, according to another embodiment of the present invention.

FIG. 4a shows a cross-sectional view of another embodiment of introduction tube 22 of a spray design. In the instant embodiment, introduction tube 22 may include an opening 60 positioned inside the tube at the exit end that leads in a direction toward the catalyst in the sample chamber (not shown). In the instant embodiment, introduction tube 22 includes an I.D. along the length of about 1.4 mm and an O.D. of about 2.4 mm. But, dimensions are not intended to be limited. For example, dimensions will depend in part on the O.D. of the MAS rotor and components into which introduction tube 22 is inserted when assembled. In the instant embodiment, opening 60 includes a diameter of about 0.2 mm. In the instant spray design, the I.D. of tube 22 may narrow in a region 62 to a size that couples with opening 60 and may then expand in a region 64 at the exit end of introduction tube 22, described further in reference to FIG. 4c.

Figure 4C:
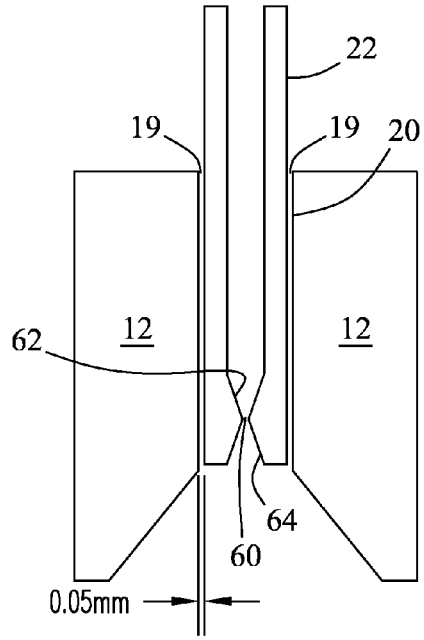
Figure 4B:
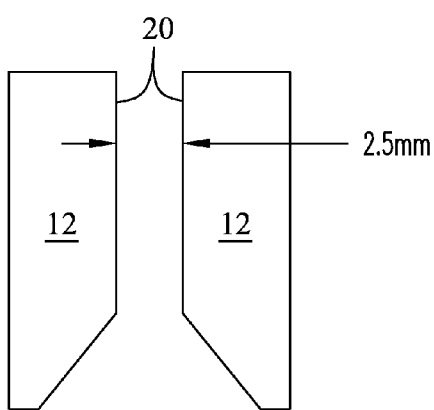

In FIG. 4b, end plug 12 into which the introduction tube inserts may include a central channel 20 (see description for FIG. 1b) that allows insertion of the introduction tube. In the instant embodiment, channel 20 may include a width around the introduction tube of about 2.5 mm, but dimensions are not intended to be limited. For example, channel 20 may expand at an end thereof to include a shape such as an inverted cone that allows a spray of reactants to be delivered from the from the exit end of the introduction tube as detailed further herein.

FIG. 4c shows a cross-sectional view of end plug 12 with introduction tube 22 inserted into channel 20. The dimension of channel 20 provides a clearance 19 of between about 0.05 mm and about 0.3 mm between the inner wall of end plug 12 and the exterior surface of introduction tube 22 that runs along the inside length of end plug 12. Clearance 19 allows the rotor to rotate while introduction tube 22 remains stationary within channel 20. In the instant spray design, the I.D. of introduction tube 22 may narrow in region 62 to a size that couples with opening 60 and may then expand in region 64 after opening 60 at the exit end of introduction tube 22. Opening 60 may include a diameter of about 0.2 mm or other suitable size that provides a spray of reactants into the sample chamber. Region 62 positioned immediately in front of opening 60 of introduction tube 22 may include a shape such as a cone or an open funnel that expands after opening 60. The narrowing in region 62 may include an angle, e.g., of about 35 degrees. Region 64 of introduction tube 22 positioned immediately after opening 60 may include a shape such as an inverted cone or another suitable shape that expands to permit a spray of reactants to be delivered from opening 60 at the exit of introduction tube 22 into the sample chamber. Expansion in region 64 following opening 60 may include a span angle of, e.g., about 65 degrees. However, shapes and angles are not intended to be limited. For example, shape of region 62 leading into, and region 64 leaving from, opening 60 serves only to deliver a spray of fluid containing zero, one or more, or a mixture of reactants directly through the glass wool disk (FIG. 1 b) or other containment member into the sample chamber. Shapes are preferred that disperse the fluids into the sample chamber so that span the width of the catalyst or other solid positioned at the top of the sample chamber and promote disbursement of reactants through the catalyst or other solid. Thus, no limitations are intended by the description to exemplary shape dimensions and/or exemplary angles directed to the instant embodiment. All configurations as will be implemented by those of ordinary skill in the art in view of this disclosure are within the scope of the invention.

Continuous-Flow MAS NMR Probe Applications

Probe 200 has wide applications in the study of catalysts and catalytic reactions in situ under constant flow or stopped-flow conditions. For example, as detailed hereafter, spectra obtained with the CF-MAS NMR rotor 100 and probe 200 may determine reactants, reaction transition states, and products from catalytic reactions in situ. In the exemplary application detailed hereafter, reactants, reaction transition states, and products from catalytic reactions may all be detected in a single $^{13}$C CF-MAS NMR measurement or spectrum under natural abundance conditions in situ. Coke products can also be detected at natural $^{13}$C abundance, or under stopped-flow conditions. In addition, surface functional groups can be identified under dry conditions in situ. And, reaction dynamics of, e.g., dehydration reactions of exemplary organic species (e.g., 2-butanol) over an exemplary catalyst can be examined, as detailed hereafter.

Validation of Flow

Figure 5A:
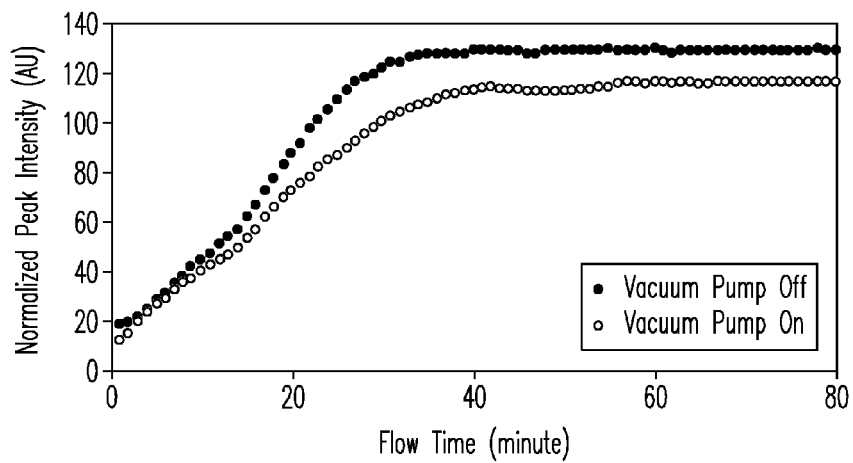
FIG. 5a compares $^1H$ CF-MAS NMR spectra collected in situ for an exemplary reactant flowed through a catalyst within the sample chamber of the CF-MAS NMR probe as a function of flow time with and without a vacuum pump operating.
Figure 5B:
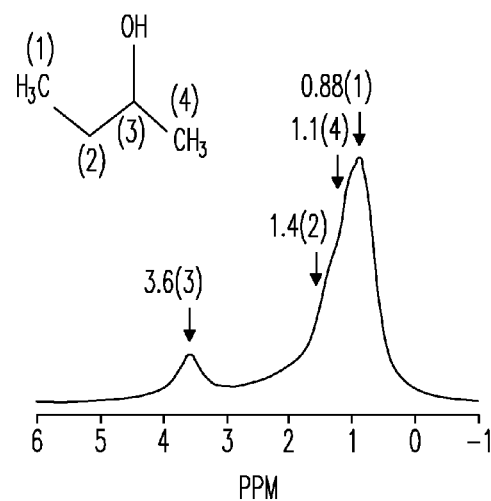
FIG. 5b shows the integrated $^1H$ CF-MAS NMR spectrum for the reactant of FIG. 5a with corresponding peak assignments.

FIG. 5a compares in situ $^1$H CF-MAS NMR spectra collected with the CF-MAS NMR probe 200 as a function of flow time for a selected reactant (e.g., 2-butanol) conducted over a mesoporous silicalite material (e.g., meso-silicalite-1). The reaction was carried out at 73° C. under a flow rate for 2-butanol of 1.5 mL/hour and a flow rate for the carrier gas (N$_2$) of 100 sccm (standard cubic center meters per minute). A sample spinning rate of 3.5 kHz was used for both experiments. Each data point in the spectrum was acquired using 32 scans and a recycle delay time of 2 seconds. Integration range for obtaining the integrated spectral intensity was from −1 ppm to 5 ppm. Peak intensity data are compared with and without a vacuum pump (described in reference to FIG. 3) operating. No reactions are observed because the meso-silicalite-1 catalyst is inert to 2-butanol. Results show the integrated peak intensity at equilibrium is lower when the vacuum pump is on than when the vacuum pump is off, which confirms a flow of reactant within the catalyst. FIG. 5b shows an in situ $^1$H CF-MAS spectrum showing peak assignments for the reactant 2-butanol flowed over a period of 40 minutes through the catalyst within the sample chamber of the CF-MAS NMR probe. Peak assignments were made as detailed, e.g., by Jackman et al. (*The Nuclear Magnetic Resonance Spectrum of 2-Butanol*. Journal of the American Chemical Society, 1966. 88 (23): p. 5565-5570).

Investigation of Surface Functional Groups In Situ

Figure 6A:
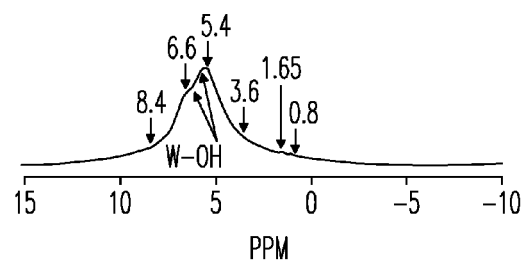
FIG. 6a-6d compare a conventional ex-situ $^1H$ MAS NMR spectrum to in-situ $^1H$ CF-MAS NMR spectra acquired in accordance with the present invention.
Figure 6B:
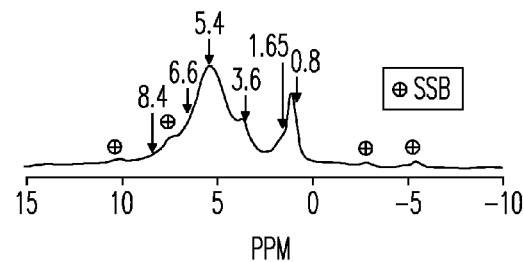
Figure 6C:
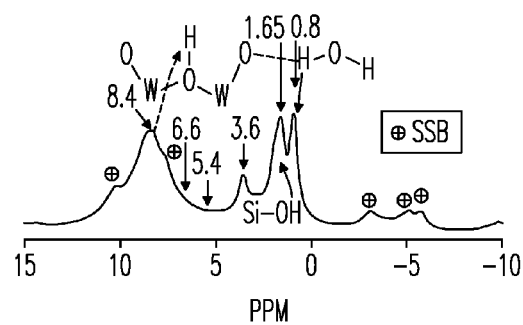
Figure 6D:
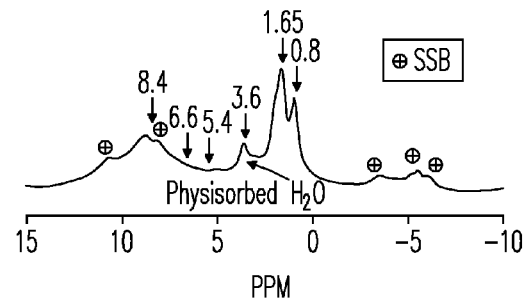

The present invention allows investigation of reactions that occur at the surface of solids and catalysts. FIG. 6a shows a conventional ex-situ $^1$H MAS NMR spectrum collected for a solid powder which is compared hereafter to FIGS. 6b-6d showing in-situ $^1$H CF-MAS NMR spectra acquired on a selected catalyst in accordance with the present invention. In FIG. 6a, the ex situ $^1$H MAS NMR spectrum was obtained for a solid powder [W(OH)$_6$] using a conventional probe at a sample spinning rate of 5 kHz. FIG. 6b shows an in situ $^1$H CF-MAS NMR spectrum obtained for a freshly synthesized 28% HPA/meso-silicalite-1 catalyst acquired at room temperature immediately after loading the catalyst into the probe and prior to flowing N$_2$ carrier gas through the catalyst. The freshly synthesized catalyst was exposed to air for about 24 hours prior to acquiring data. Two major peaks are positioned at about 1.0 ppm (sharp) and about 5.4 ppm (broad), respectively. Two shoulder peaks are also observed at about 1.65 ppm and about 3.6 ppm, respectively. In addition to various surface functional groups, expectation was that the catalyst surface would be initially covered with weakly absorbed H$_2$O molecules or a thin layer of H$_2$O. Although the broad 5.4 ppm peak has a chemical shift position similar to that of W(OH)$_6$ observed in the ex situ spectrum (FIG. 6a), the peak cannot be assigned to the W—OH group as such a structure in 28% HPA/meso-silicalite-1 is not feasible. The 5.4 ppm peak is also not assigned to bulk H$_2$O as bulk H$_2$O appears at about 4.8 ppm. Based on literature reports, the 1.65 ppm peak and the 3.6 ppm peak can be theoretically assigned to a Si—OH species (positioned at 1.65 ppm) or a physisorbed H$_2$O species (positioned at 3.6 ppm), respectively. However, the 1.0 ppm is difficult to assign based on data in the current figure.

FIG. 6c shows a spectrum acquired in situ after drying the sample of FIG. 6b at 100° C. and flowing a dry nitrogen (N$_2$) carrier gas through the catalyst at a flow rate of 100 sccm for 24 hours. Results show that drying the catalyst in situ under a constant flow of dry nitrogen gas removes weakly absorbed H$_2$O molecules on the surface. The broad peak at about 8.4 ppm corresponds to highly acidic protons not observed for the fresh catalyst (see FIG. 6b). Here, acidic protons of supported HPA on the porous silicate materials, or associated Brönsted acid sites, are attributed to tungsten-bridging W—OH—W protons of the W—OH—W bridge groups of HPA. Three additional peaks with chemical shifts less than and or equal to 3.6 ppm are also well resolved. Peak centers positioned at 3.6 ppm and 1.65 ppm remain unchanged. The peak observed originally at about 1.0 ppm is shifted to a lower ppm position of about 0.8 ppm. The shift means the peak can be attributed to a hydrogen (proton) that is coupled to oxygen (i.e., the H$_2$O molecule in the WO group). Results show that using in situ drying to remove weakly bonded surface H$_2$O molecules at moderate temperature permits surface proton functional groups to be effectively studied using CF-MAS $^1$H NMR.

FIG. 6d shows a spectrum acquired after the spectrum of FIG. 6c after: 1) flowing H$_2$O through the catalyst bed at a temperature of 100° C. for 48 hours at a rate of 1.5 m/h in a nitrogen (N$_2$) carrier gas flowed at a flow rate of 100 sccm for 2 days, and then 2) drying the sample at 120° C. for 24 hours. At the end of the drying, an in situ CF-MAS $^1$H NMR spectrum was acquired. Spectra were acquired using 32 scans and a recycle delay time of 2 seconds. In the figure, peaks labeled with asterisks (*) denote presence of sample spinning side bands (or SSBs). Results highlight the utility of studying catalyst stability using in situ CF-MAS $^1$H NMR. In the figure, spectral resolution is similar to that of FIG. 6c. However, relative peak intensity for Si—OH functional groups (i.e., positioned at 1.65 ppm) is noticeably enhanced. Results provide clear evidence that some locations of the meso-silicalite-1 catalyst surface originally covered by HPA are now exposed. Results also provide evidence that some agglomeration of HPA particles occurs over time as a consequence of flowing H$_2$O constantly through the catalyst.

Study of Reaction Dynamics In-Situ Using $^1$H CF-MAS NMR

Due to hydrogen's (i.e., $^1$H) large geomagnetic ratio and nearly 100% natural abundance, $^1$H MAS NMR offers the highest NMR sensitivity among all NMR visible nuclei and is thus attractive for in situ investigation of reaction dynamics. For example, in some applications, in situ $^1$H MAS NMR spectra can be acquired using a single scan with the CF-MAS probe described herein, e.g., with a time resolution as short as about one second. In other applications, more scans may be used if the reaction under investigation includes a reaction time of from minutes to hours, e.g., as in the dehydration reaction of 2-butanol detailed herein.

Figure 7:
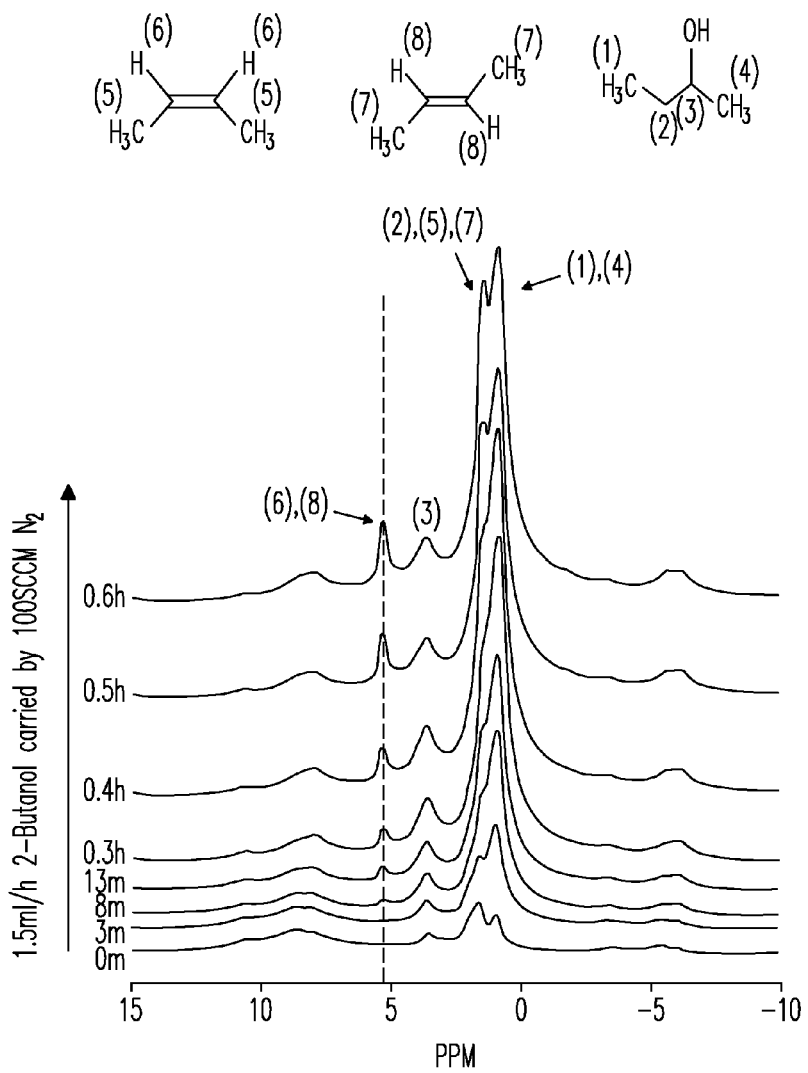
FIG. 7 shows in situ $^1H$ CF-MAS NMR spectra for an exemplary reactant an exemplary meso-silicalite-1 catalyst as a function of flow time.

FIG. 7 compares in-situ $^1$H CF-MAS NMR spectra collected as a function of time for an exemplary hydrocarbon (e.g., 2-butanol) introduced to an exemplary catalyst bed (28% HPA/meso-silicalite-1) as a function of flow time. Flow rate for the 2-butanol reactant was 1.5 mL/h. Flow rate for the nitrogen carrier gas was 100 sccm (at room temperature). Spectra were acquired using 32 scans and a recycle delay time of 2 seconds. Sample spinning rate was 3.5 kHz for all measurements. Reaction temperature inside the sample chamber (i.e., catalyst bed) was at 73° C., but is not limited thereto. Before 2-butanol reaches the catalyst (set as the time zero), the in situ CF-MAS $^1$H NMR spectrum is the same as that of FIG. 6d due to the fact that the data in FIG. 7 were acquired immediately after FIG. 6d. A distinct reaction product peak located at about 5.4 ppm is clearly observed at a flow time of about 8 minutes. The 5.4 ppm peak can be attributed to cis- and trans-protons in the 2-butanol molecule. Intensity of the 5.4 ppm peak increases with flow time and a plateau is reached at a flow time of approximately 0.5 hours. The peak at 3.6 ppm (labeled "3") in the figure corresponds to the CH proton in 2-butanol, which overlaps with the peak from physisorbed H$_2$O. The 3.6 ppm peak also increases with flow time, reaching a plateau at a flow time of approximately 0.3 hours. Other peaks corresponding to reactants and reaction products overlap over a chemical shift range from 0 to about 2.2 ppm.

Data demonstrate that a constant flow of reactants over the catalyst can yield an equilibrium state in which products eluting out of the catalyst may be carried away by carrier gas. In addition, quantity of reaction products produced can equate with quantity of reactants introduced and flowed over the catalyst for a given flow period. Thus, a stable condition may be established in the catalyst system under investigation that permits, e.g., exploration of how reactants interact with the catalyst surface, and identification of stable reaction intermediates/transition states. $^1$H MAS NMR is highly sensitive, but spectral resolution can be limited, e.g., when two isomers of a reaction product are generated (e.g., cis-2-butene and trans-2-butene). Limitations can be at least partially overcome by performing in situ $^{13}$C CF-MAS NMR which has a greater spectral resolution and a larger chemical shift range (about 200 ppm) than $^1$H MAS NMR (about 15 ppm) and thus a much higher sensitivity for identifying subtle structural changes.

Natural Abundance Investigations Using $^{13}$C CF-MAS NMR

Figure 8A:
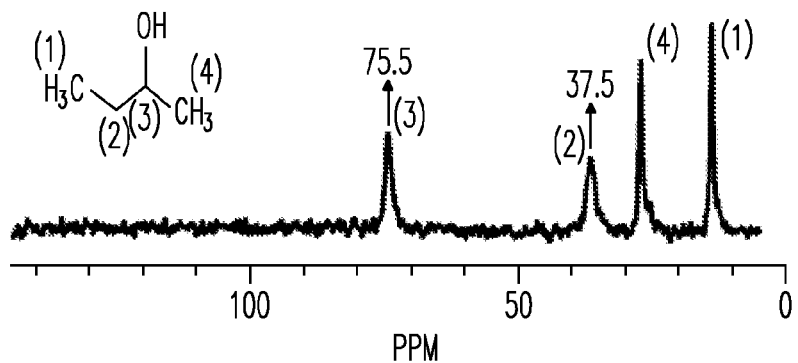
FIGS. 8a-8c show in situ $^{13}C$ CF-MAS NMR spectra for natural abundance measurements of an exemplary reactant.
Figure 8B:
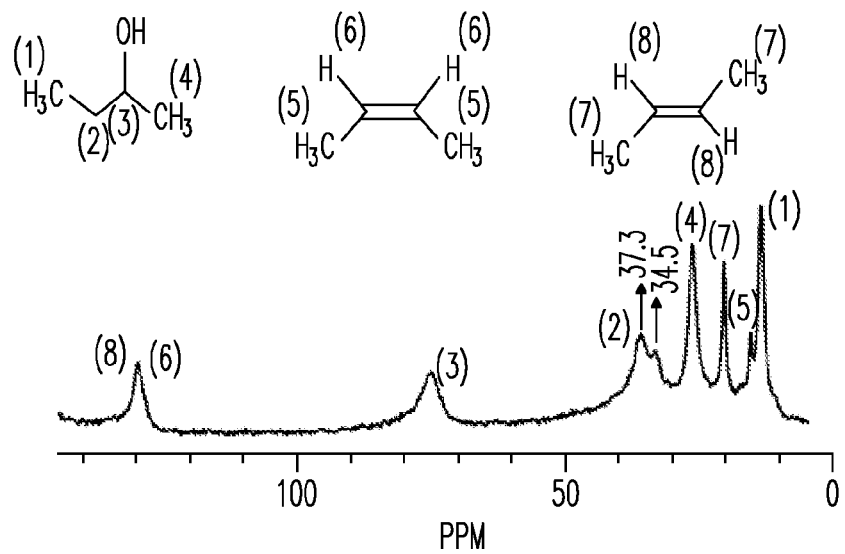
Figure 8C:
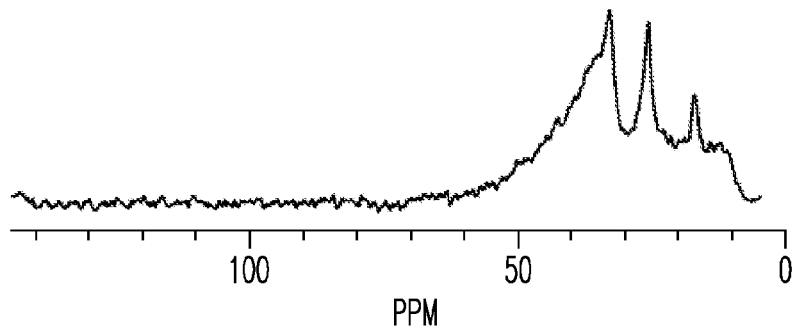

FIGS. 8a-8c show $^{13}$C CF-MAS NMR spectra acquired in situ from natural abundance measurements of 2-butanol.

Temperature of the catalyst sample was 73° C. Flow rate of the nitrogen ($N_2$) carrier gas was 100 sccm. Peak assignments in the figures are based on quantum chemistry calculations for the $^{13}$C isotropic chemical shift values of 2-butanol (I), cis-2-butene (II), trans-2-butene (III), 1-butene (IV), propene (V), and 2-methylpropene (VI), respectively. All other peaks are scaled or referenced to the carbon peak.

TABLE 1 lists isotropic chemical shift values (experimental and Density Functional Theory (DFT-calculated values) for carbons at numbered positions in these molecular compounds, i.e., (I) through (VI). Chemical shift values of carbon [i.e., labeled as "1"] are set at the calculated value, i.e., 14.8 ppm to aid in the assignments.

TABLE 1

Isotropic chemical shift values for carbons of selected molecular structures at numbered positions in FIG. 8.

| Molecule: | Carbon Position | Chemical Shift (Experimental) | Chemical Shift (DFT) (Calculated) |
|---|---|---|---|
| 2-butanol (I) | 1 | 14.8 | 14.8 |
| " | 2 | 37.5 | 39.8 |
| " | 3 | 75.5 | 86.0 |
| " | 4 | 28.2 | 29.7 |
| cis-2-butene (II) | 5 | 16.7 | 15.0 |
| " | 6 | 131.2 | 139.8 |
| trans-2-butene (III) | 7 | 21.8 | 17.0 |
| " | 8 | 131.2 | 140.6 |
| " | 9 | — | 121.0 |
| " | 10 | — | 157.4 |
| " | 11 | — | 38.6 |
| 1-butene (IV) | 12 | — | 18.6 |
| propene (V) | 13 | — | 126.4 |
| 2-methylpropene (VI) | 14 | — | 147.7 |
| " | 15 | — | 17.9 |
| " | 16 | — | 117.6 |
| " | 17 | — | 162.8 |
| " | 18 | — | 28.3 |
| " | 19 | — | 28.3 |

FIG. 8a shows a natural abundance $^{13}$C CF-MAS NMR spectrum of 2-butanol flowing through meso-silicalite-1 in-situ at a flow rate of 1.5 ml/hour at a reaction temperature of 73° C. Number of accumulations was 1530. A Lorentz line broadening of 25 Hz was applied before Fourier transformation. In the figure, four peaks (14.8 ppm, 28.2 ppm, 37.5 ppm, and 75.5 ppm) corresponding to the four carbons of 2-butanol are observed, indicating that meso-silicalite-1 is inert (i.e., not reactive) to 2-butanol. In contrast, when 2-butanol is flowing through 28% HPA/meso-silicalite-1 under the same experimental conditions, peaks corresponding to various reaction products are observed at 16.7 ppm (i.e., methyl carbon of cis-2-butene), 21.8 ppm (methyl carbon of trans-2-butene), and 131.2 ppm (CH carbons for both cis-2-butene and trans-2-butene). Peak area ratio (trans-2-butene to cis-2-butene) is about 2.5 to 1.

FIG. 8b shows 2-butanol flowing through 28% HPA/meso-silicate-1 at a flow rate of 1.5 ml/h. Number of accumulations was 10,990. A Lorentz line broadening of 25 Hz was applied before Fourier transformation. In the figure, 1-butene, propene and 2-methylpropene are not observed as evidenced by the absence of signature peaks associated with double bond carbons in these molecules. In addition to reaction product results, the peak line width corresponding to the CH carbon of the 2-butanol (labeled as "3") is significantly broadened, i.e., from 186 Hz in FIG. 8a to 522 Hz in FIG. 8b. Peak position for "3" is also slightly shifted to a higher ppm, i.e., from 75.5 ppm in FIG. 8a to 76.6 ppm in FIG. 8b. Furthermore, a shoulder peak located at about 34.5 ppm is also observed in FIG. 8b, corresponding to the —$CH_2$ carbon, labeled as "2" in 2-butanol. Both the observed line broadening and the shoulder peak indicate that the —OH group and the —$CH_2$ carbon in 2-butanol interact with the catalyst surface. The —OH group in 2-butanol may also be interacting with Brönsted acid sites (i.e., the W—OH—W) of supported HPA via hydrogen bonding between the tungsten-bridging acidic proton and oxygen in the —OH group of 2-butanol. Additional mechanistic features may be investigated. No limitations are intended.

FIG. 8c shows a "stopped flow" $^{13}$C MAS spectrum acquired in situ after the spectrum of FIG. 8b and after volatile products and reactants were purged from the catalyst bed (i.e., 28% HPA/meso-siliclite-1) under a constant flow of $N_2$ at 100 sccm for 10 hours. Potential for coke formation in the catalyst was investigated after the long run time. Number of accumulations was 30,000. A Lorentz line broadening of 50 Hz was applied before Fourier transformation. Results show that both the 131.2 ppm peak and the 76.6 ppm peak are absent, indicating that the reactant 2-butanol (and products including trans-2-butene and cis-2-butene), were thoroughly purged from the catalyst bed, leaving only coke products behind, as evidenced by the $^{13}$C signals. The peaks cover a range from about 10 to about 49 ppm with three relatively sharp peaks observed at 19, 27.8, 35 and a broader peak at 40 ppm. A chemical shift range from 10 to 40 ppm corresponds to aliphatic carbons without C—O and C=C bonds. The $^{13}$C signals show the coke products contain mainly aliphatic carbons or aliphatic carbon networks that lack C—O and C=C bonds.

The following EXAMPLES provide a further understanding of various aspects of the present invention.

EXAMPLE 1

Catalyst

Heteropoly acid (HPA) [$H_3PW_{12}O_{40} \cdot nH_2O$] supported on mesoporous silicalite (e.g., meso-silicalite-1) was used as the catalyst. Synthesis of the catalyst was performed as reported by Liu et al. [in "*Characterization of Dispersed Heteropoly Acid on Mesoporous Zeolite Using Solid-State (31)P NMR Spin-Lattice Relaxation*", Journal of the American Chemical Society, 2009. 131(28): p. 9715-9721]. Catalyst properties characterized by XRD, TEM/SEM and $^{31}$P MAS NMR spectroscopy were taken from the literature report. Meso-silicalite-1 has a BET surface area of 418 $m^2/g$. The 28% weight percentage loaded HPA/meso-silicalite-1 has a BET surface area of 285 $m^2/g$.

EXAMPLE 2

NMR Measurements

In situ CF-MAS $^1$H and $^{13}$C experiments were performed on a Varian 500 MHz (11.7T) NMR spectrometer with $^1$H and $^{13}$C Larmor frequencies of 500.19 MHz and 125.79 MHz, respectively. A single pulse sequence with proton decoupling was used for $^{13}$C observation, and a 90 degree pulse angle with a pulse width of 8 μs and a decoupling field strength of approximately 25 kHz were employed. For $^1$H observation, a 30 degree angle pulse and a pulse width of 4 μs were used. A sample spinning rate of 3.5 kHz was used for all measurements. Fine powders of meso-silicalite-1 and 28% HPA/meso-silicalite-1 with particle sizes of approximately 5 μm (i.e., ~5 microns) were used. Meso-silicate-1 or 28% HPA/meso-silicalite-1 at a thickness of approximately 8 mm was packed tightly inside the sample chamber sandwiched between two layers of glass wool and ceramic end plugs inside the CF-MAS rotor. Sample temperature was calibrated using $^{207}$Pb MAS NMR using a solid powder of Pb(NO$_3$)$_2$ at a sample spinning rate of 3.5 kHz. To ensure temperature accuracy, sample spinning rate, flow rate of the N$_2$ heating gas, and the driving and bearing nitrogen gas pressures were the same as those employed for the calibration of the $^{207}$Pb MAS NMR experiment.

EXAMPLE 3

Theoretical Calculations and Methods

Density function calculations were performed using the Amsterdam Density Functional (ADF®) program for molecules (Scientific Computing & Modelling, Amsterdam, Netherlands). Geometries were optimized and isotropic chemical shielding values of the chemical shielding tensor were calculated at the BLYP/QZ4P level of theory. Under these conditions, the calculated $^{13}$C isotropic chemical shielding value for Si(CH$_3$)$_4$ (TMS) was 176.3 ppm. Shielding values were converted to the experimental chemical shift scale relative to TMS (0 ppm) according to $\delta$ (ppm)=176.3 ppm−$\delta_{calculated}$ (ppm).

EXAMPLE 4

Sensitivity and Temperature Test

Using adamantane as a test sample, sensitivity of the 9.6 mm (ID of 8 mm) large-sample-CF-MAS probe was found to be approximately 2 times that of a standard commercial 7.5 mm (I.D. of 6 mm) CP/MAS probe using a tightly packed sample cylinder of approximately 10 mm in height for both cases. Sensitivity enhancement is consistent with the expected volume increase, suggesting that the sensitivity of the 9.5 mm CF-MAS probe meets expectations. Using a home-made heating stack, under the conditions of VT N$_2$ gas flow of 70 L/min, driving N$_2$ gas pressure of 32.5 psi, bearing N$_2$ gas pressure of 37.3 psi, a stable sample spinning rate of 3.5 kHz was reached and a temperature up to 230° C. was achieved.

EXAMPLE 5

Validating Flow in the Catalyst

Gases can flow through a tube containing porous catalysts as long as there is a pressure difference at the two ends of catalyst bed. Flow rates and patterns inside the catalyst bed can depend on factors such as the value of the pressure difference at both ends of the catalyst bed, thickness of the catalyst, properties of both the internal (i.e., the intrinsic pore structures of the catalysts) and external structure (i.e., the space distribution between the catalyst particles), properties of the gases and operation temperatures, and etc. Experiments were carried out to validate existence of flow in the catalyst located within the sample chamber of the CF-MAS NMR rotor, those with a vacuum pump (e.g., a Diaphragm Membran-Vakuum Pumpe with a maximum 1.7/2.0 m$^3$/hour capacity from BrandTech Scientific, Inc., Essex, Conn., USA) turned on and those without a vacuum pump turned on. Meso-silicalite-1 is inert to 2-butanol at 73° C. Thus, in situ CF-MAS $^1$H NMR experiments with and without the vacuum pump turned on were carried out on the catalyst as a function of time by flowing 2-butanol at a rate of 1.5 mL liquid/hour at this temperature. 2-butanol was injected/mixed into a flow of dry N$_2$ carrier gas at room temperature using a combination of a syringe pump and a mass flow controller positioned outside the NMR superconducting magnet before flowing into the sample chamber of the CF-MAS NMR probe. Flow rate of the carrier gas was set at 100 sccm. Results are shown in FIG. 5a. Data show that the integrated peak intensity at equilibrium when the vacuum pump is on is lower than when the vacuum is off. This can only be possible if a flow is formed inside the catalyst bed. For an idea gas, it is well known that P=(n/V)×R×T, where P is the pressure, R is the universal gas constant, T is the temperature in K, and (n/V) is the number of mole of gas molecules per unit volume. When the vacuum pump was off, P is about 1 atm everywhere inside the catalyst bed. When the vacuum pump is on, P decreases linearly from 1 atm at the injection end of the catalyst to nearly zero at the exit end of the catalyst, where the vacuum pump is attached, which causes a linear drop in pressure drop inside the catalyst. T is almost constant across the catalyst, which gives a linear decrease in the value of (n/V) across the catalyst. Total quantity of 2-butanol decreases, resulting in a decrease in the integrated peak area at equilibrium when the vacuum pump is on. Integrated peak intensity only decreases by about 15%, indicating that a major portion of 2-butanol remains inside internal pores of the catalyst, which is affected less by flow due to the confined pore structures. 2-butanol molecules located in inter spaces between catalyst particles is most affected by flow. Diffusion allows for exchange of molecules inside the inner pores of the catalysts with molecules located in the spaces between the catalyst particles.

While a number of embodiments of the present invention have been shown and described, it will be apparent to those skilled in the art that many changes and modifications may be made without departing from the invention in its broader aspects. The appended claims are therefore intended to cover all such changes and modifications as fall within the scope of the invention.

What is claimed is:

1. A nuclear magnetic resonance (NMR) probe for high resolution in situ NMR investigations, the probe comprising:
   a magic angle spinning (MAS) rotor that defines a sample chamber with an internal volume greater than or equal to about 0.01 cm$^3$ configured to contain and rotate a catalyst or a solid therein;
   a first (top) end plug disposed above the sample chamber comprising an introduction tube that couples to at least three inlets, the inlets are configured to introduce a carrier gas containing one or more reactants or a mixture thereof to a catalyst or a solid within the sample chamber at a pressure at or above atmospheric pressure;
   a second (bottom) end plug disposed below the sample chamber comprising an exit tube that couples to at least three outlets, the outlets are configured to collect one or more reaction products when released from the catalyst or solid within the sample chamber at a pressure below atmospheric pressure; and
   a spin (drive) tip disposed below the second end plug through which the exit tube from the second end plug extends, the exit tube delivers the one or more reaction products collected from the sample chamber in the at least three outlets as the rotor rotates, the exit tube couples operatively to a vacuum pump or device disposed external to the rotor that maintains the pressure difference between the inlets and outlets within the rotor.

2. The probe of claim 1, wherein one of the at least three inlets is centrally disposed.

3. The probe of claim 1, wherein the at least three inlets are configured to deliver the carrier gas containing the one or more reactants or mixtures thereof into the catalyst or solid at the top of the sample chamber that uniformly spans the length and width thereof.

4. The probe of claim 1, wherein the introduction tube includes a spray nozzle at an end thereof configured to spray the carrier gas containing the one or more reactants or mixtures thereof uniformly into the at least three inlets.

5. The probe of claim 1, wherein the outlets below the sample chamber include an orientation that is other than centrally disposed to prevent the one or more reactants or mixtures thereof introduced at the top of the sample chamber from channeling through the bottom of the sample chamber at the low differential pressure.

6. The probe of claim 1, wherein the end plugs are comprised of a ceramic or a plastic.

7. The probe of claim 1, wherein the introduction tube in the first (top) end plug and the exit tube in the second (bottom) end plug are centrally disposed therein and configured to remain stationary as the MAS rotor rotates.

8. The probe of claim 1, wherein the MAS rotor includes containment members disposed above and below in contact with the sample chamber to contain the catalyst or solid therein.

9. The probe of claim 8, wherein the containment members include or are composed of glass wool.

10. The probe of claim 1, wherein the introduction tube couples to a gas inlet disposed external to the rotor that delivers the carrier gas containing the one or more reactants or mixtures thereof into the rotor.

11. The probe of claim 10, wherein the gas inlet couples to a programmable syringe pump or one or more mass flow controllers that delivers the carrier gas containing the one or more reactants or mixtures thereof into the rotor at a constant rate or in a pulsed mode.

12. The MAS rotor of claim 1, wherein the exit tube in the spin tip couples operatively to a GC-mass spectrometer that determines composition and reaction dynamics of volatile reaction products generated in-situ in the sample chamber of the MAS rotor.

13. A magic angle spinning (MAS) nuclear magnetic resonance (NMR) rotor for NMR investigations in situ, the rotor comprising:

a sample chamber with an internal volume greater than or equal to about 0.01 cm$^3$ configured to contain and rotate a catalyst or a solid therein;

a first (top) end plug disposed above the sample chamber comprising an introduction tube that couples to at least one inlet, the at least one inlet is configured to deliver one or more reactants or a mixture thereof in a carrier gas to a catalyst or a solid introduced within the sample chamber at a pressure at or above atmospheric pressure;

a second (bottom) end plug disposed below the sample chamber comprising an exit tube that couples to at least three outlets, the outlets are configured to collect one or more reaction products when released from the catalyst or solid within the sample chamber at a pressure below atmospheric pressure; and a spin (drive) tip disposed below the second end plug through which the exit tube from the second end plug extends, the exit tube couples to a vacuum pump or device disposed external to the rotor that maintains a differential pressure between the inlets and outlets within the rotor to deliver the one or more reaction products collected in the at least three outlets from the rotor as the rotor rotates.

14. The MAS rotor of claim 13, wherein the introduction tube includes a spray nozzle at an end thereof configured to spray the carrier gas, the reactants, or mixtures thereof uniformly into the at least one inlet.

15. The MAS rotor of claim 13, wherein one of the at least one inlets is centrally disposed.

16. A method for performing high resolution magic angle spinning (MAS) NMR investigations in situ, comprising the steps of:

providing the NMR probe according to claim 1 spinning the catalyst or the solid within the sample chamber in the MAS rotor at a selected rotation speed;

flowing one or more reactants or mixtures thereof in the carrier gas into the catalyst or solid within the sample chamber at a pressure at or above atmospheric pressure to convert the reactants therein to one or more reaction products; and acquiring NMR spectra as a function of time as the reactants are flowed into the catalyst or solid; and analyzing reactions occurring within the catalyst or solid within the sample chamber in situ as a function of the flow-in time of the reactants as reaction products are collected from the sample chamber at a pressure below atmospheric pressure.

\* \* \* \* \*